United States Patent
Paoloni et al.

(10) Patent No.: US 10,229,807 B2
(45) Date of Patent: Mar. 12, 2019

(54) AMPLIFICATION OF ELECTROMAGNETIC WAVES VIA INTERACTION WITH AN ELECTRON BEAM BY USING A WAVEGUIDE HAVING A LINEAR INTERACTION CHANNEL WITH CURVED PARTS AND INCLUDING ROWS OF PILLARS EXTENDING THROUGH THE WAVEGUIDE

(71) Applicant: Lancaster University Business Enterprises Limited, Lancaster (GB)

(72) Inventors: Claudio Paoloni, Lancaster (GB); Mauro Mineo, Lancaster (GB)

(73) Assignee: Lancaster University Business Enterprises Limited, Lancaster (GB)

( * ) Notice: Subject to any disclaimer, the term of this patent is extended or adjusted under 35 U.S.C. 154(b) by 0 days.

(21) Appl. No.: 15/519,018

(22) PCT Filed: Oct. 13, 2015

(86) PCT No.: PCT/GB2015/052993
§ 371 (c)(1),
(2) Date: Apr. 13, 2017

(87) PCT Pub. No.: WO2016/059388
PCT Pub. Date: Apr. 21, 2016

(65) Prior Publication Data
US 2017/0230010 A1    Aug. 10, 2017

(30) Foreign Application Priority Data
Oct. 14, 2014  (GB) .................................. 1418133.3

(51) Int. Cl.
*H01J 23/16* (2006.01)
*H01J 23/36* (2006.01)
*H01J 25/02* (2006.01)
*H03F 3/54* (2006.01)
*H03F 3/58* (2006.01)
*H01P 3/12* (2006.01)
*H03F 1/06* (2006.01)
*H03F 3/189* (2006.01)

(52) U.S. Cl.
CPC .............. *H01J 23/16* (2013.01); *H01J 23/36* (2013.01); *H01J 25/02* (2013.01); *H01P 3/12* (2013.01); *H03F 1/06* (2013.01); *H03F 3/189* (2013.01); *H03F 3/54* (2013.01); *H03F 3/58* (2013.01)

(58) Field of Classification Search
CPC .. H01J 23/16; H01J 23/34; H01J 23/36; H01J 25/02; H01J 25/34; H01J 25/61
USPC .............................. 315/5.24, 5, 5.29, 4, 5.39
See application file for complete search history.

(56) References Cited

U.S. PATENT DOCUMENTS

| | | | | |
|---|---|---|---|---|
| 2,469,964 A | * | 5/1949 | Hartman | H01J 25/74 315/13.1 |
| 2,708,236 A | * | 5/1955 | Pierce | H01J 23/24 315/3.5 |

(Continued)

*Primary Examiner* — Benny Lee
(74) *Attorney, Agent, or Firm* — Goodwin Procter LLP

(57) ABSTRACT

The present invention is a rectangular waveguide providing amplification of an electromagnetic wave via interaction with an electron beam in a linear interaction channel where the electron beam enters the waveguide at a first curved part of the waveguide, traverses the linear interaction channel and exits the waveguide at a second curved part of the waveguide.

19 Claims, 4 Drawing Sheets

(56) References Cited

U.S. PATENT DOCUMENTS 2,959,707 A * 11/1960 Wilmarth ................ H01J 23/24
                                                    315/3.5
4,617,493 A * 10/1986 Lau ........................ H01J 25/10
                                                    315/3

* cited by examiner

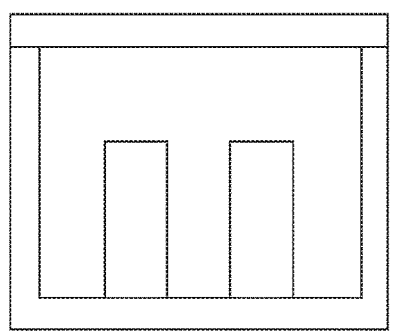
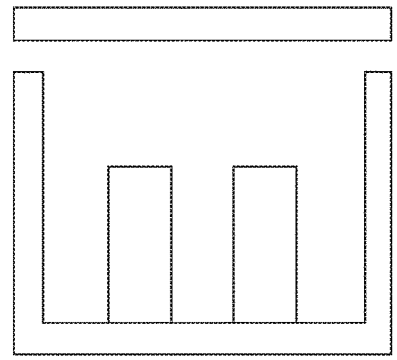
FIG. 5A    FIG. 5B
  
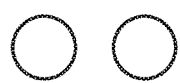  
 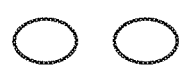 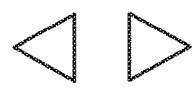
FIG. 6A    FIG. 6B    FIG. 6C

AMPLIFICATION OF ELECTROMAGNETIC WAVES VIA INTERACTION WITH AN ELECTRON BEAM BY USING A WAVEGUIDE HAVING A LINEAR INTERACTION CHANNEL WITH CURVED PARTS AND INCLUDING ROWS OF PILLARS EXTENDING THROUGH THE WAVEGUIDE

CROSS-REFERENCE TO RELATED APPLICATIONS

This application is a U.S. national stage application under 35 U.S.C. § 371 of International Application No. PCT/GB2015/052993, filed on Oct. 13, 2015, which claims priority to and the benefit of United Kingdom Patent Application No. 1418133.3, filed on Oct. 14, 2014, each of which is incorporated by reference herein in its entirety.

FIELD OF THE INVENTION

Embodiments of the invention relate to a rectangular waveguide providing amplification of an electromagnetic wave via interactions with an electron beam in a linear interaction channel. The present invention relates to a device able to operate as an amplifier or oscillator at gigahertz and terahertz frequencies with good gain and output power, and, more specifically, to a device whose physical design makes it straightforward to manufacture, disassemble and reassemble.

BACKGROUND OF THE INVENTION

Currently solid-state devices are able to provide only about 10 milliwatts of output power in the 200 to 300 GHz band. Travelling wave tubes ("TWT") still remain the preferred solution to generate high power over a wide spectrum in this frequency band.

Folded waveguides, staggered double grating waveguides and sine waveguides have all been demonstrated in terahertz TWTs, with cylindrical or sheet electron beams in the 100 to 850 GHz frequency range. Such waveguides have to be fabricated in two (or more) precision parts with the sealing edge critical to confinement of the propagating electromagnetic field. A very high precision assembly process is required (to eliminate misalignments that could perturb the wave propagation). New structures are desired with simpler assembly in order to lower the costs and improve repeatability and reliability.

Mineo & Paoloni (*IEEE Transactions on electron devices*, Vol. 57, no. 11, 3169, November 2010) propose a linear rectangular double-corrugated waveguide ("LDCW") slow-wave structure for terahertz vacuum devices. That device comprises two linear rows of pillars.

SUMMARY OF THE INVENTION

The present invention achieves superior performance by the use of curves. More specifically, the present invention provides required functions by a novel physical and electrical waveguide configuration. Embodiments may act as an amplifier or oscillator in the frequency band from 10 to 2,000 gigahertz. The present invention improves over previous devices in a number of significant areas, including gain, output power, ease of manufacture and ease of vacuum pumping.

The present invention may be suitably applied to the construction and implementation of particle accelerators The present invention comprises a rectangular section waveguide providing amplification of an electromagnetic wave via interaction with an electron beam in a linear interaction channel, where the electron beam enters the waveguide at a first curved part of the waveguide, traverses the linear interaction channel and exits the waveguide at a second curved part of the waveguide.

The interaction channel is defined by two parallel rows of pillars each attached substantially perpendicularly to the base of the waveguide. The rows of pillars extend around the first and second curves of the waveguide, into the linear sections of the waveguide.

There may be a void between the top of each pillar and the roof of the waveguide.

The curve of the waveguide may be such that the base and top of the waveguide are planar.

The top of the waveguide may be attached to complete manufacture and subsequently detached and re-attached.

The pillars may be not attached to the walls of the waveguide. At least one pillar in each curved part of the waveguide may be modified in shape relative to other pillars.

The present invention may operate in the 10 GHz to 2,000 GHz band, the 200 GHz to 1,000 GHz band, the 25 GHz to 250 GHz band and/or the 30 GHz to 40 GHz band The pillars may be substantially square or rectangular in section, or circular or elliptical or triangular in section.

The present invention may comprise metal components and/or components coated in metal.

BRIEF DESCRIPTION OF THE DRAWINGS

FIG. 5A shows a cross-sectional view of a section of the device in which the lid is attached to each of the walls, in accordance with some embodiments of the present invention.

FIG. 5B shows a cross-sectional view of a section of the device in which the lid is removed from the walls, in accordance with some embodiments of the present invention.

FIG. 6A shows a plan view of circular or substantially circular pillars, in accordance with some embodiments of the present invention.

FIG. 6B shows a plan view of elliptical or substantially elliptical pillars, in accordance with some embodiments of the present invention.

FIG. 6C shows a plan view of triangular or substantially triangular pillars, in accordance with some embodiments of the present invention.

DETAILED DESCRIPTION

The present invention will now be described in detail with reference to the figures.

Figure 1:
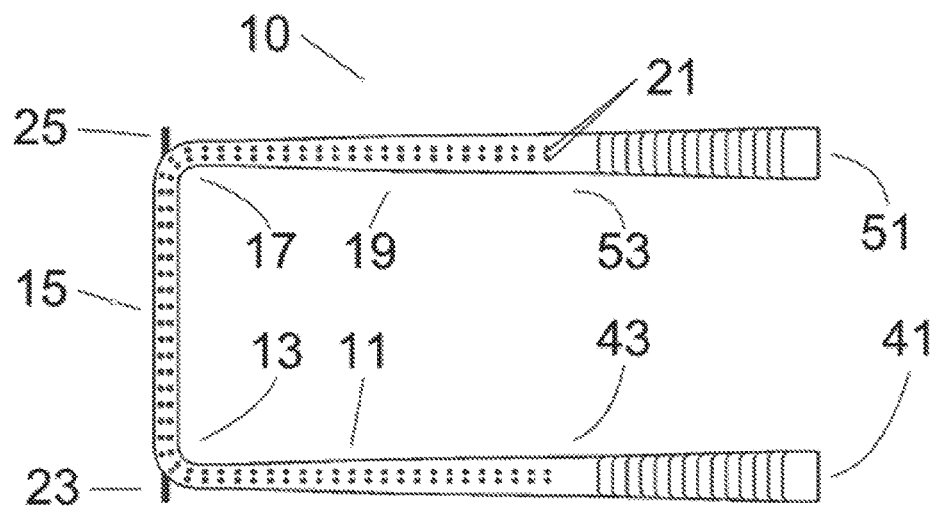
FIG. 1 shows a plan view of an embodiment of the present invention.

FIG. 1 shows a plan view of an embodiment of the present invention. The figure is not to scale.

The present invention (10) consists of a waveguide. Electromagnetic radiation enters the device through a first microwave flange (41) and exits through a second microwave flange (51).

The first flange (41) connects to a section of tapered waveguide (43) acting as a converter to a section of waveguide (11). This section of waveguide (11) connects to a first curved section (13) where an electron beam (not shown in FIG. 1) enters through a first beam tunnel (23). The electron beam and electromagnetic radiation interact within a further linear section of waveguide, the interaction section (15). The electron beam then exits via a second beam tunnel (25) at a second curved section (17). The electromagnetic radiation continues into a further linear section of waveguide (19), then into an inversely tapered section of waveguide (53) acting as a converter, and exits at the second microwave flange (51).

Within the sections of the waveguide (11, 13, 15, 17 and 19) are provided two rows of paired pillars (21) attached to the base of the waveguide but not extending to the lid, so that there is a void between the top of each pillar (21) and the lid. The pillars (21) are not attached to the walls. In this embodiment the pillars (21) are rectangular but in other embodiments there may be other shapes such as square, triangular (FIG. 6C), circular (FIG. 6A), or elliptical (FIG. 6B) pillars (21), or any cross-section adapted and/or optimised for a particular embodiment.

Electromagnetic radiation and the electron beam interact in an interaction channel defined by the pillars (21) within the interaction section (15).

Figure 2:
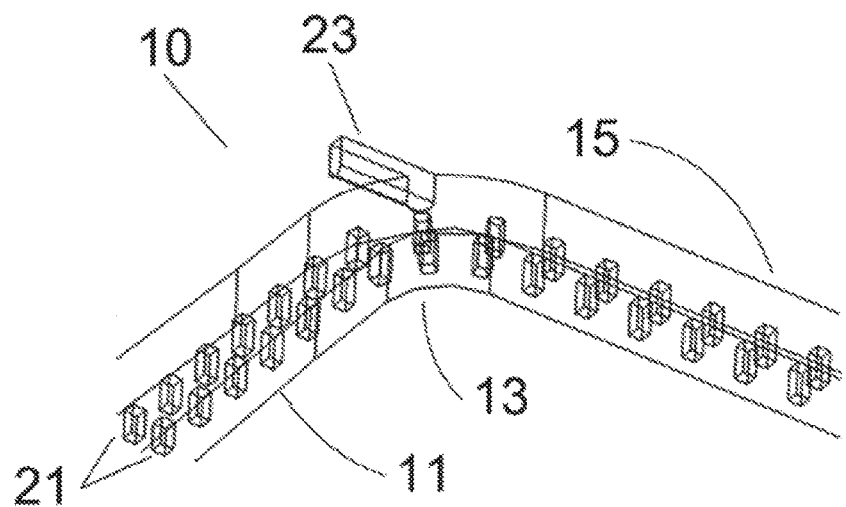
FIG. 2 shows a perspective view of part of an embodiment of the present invention.

FIG. 2 shows a perspective view of part of an embodiment of the present invention. The figure is not to scale.

FIG. 2 shows a perspective view of a first operative section of an embodiment of the present invention (10). This comprises a first linear section of waveguide (11) with rectangular cross-section, connected to a first curved section of waveguide (13) with rectangular cross-section, connected to an interaction section of waveguide (15) with rectangular cross-section.

Electromagnetic radiation enters the first section of waveguide (11) and proceeds towards the curve (13). At the curve (13) an electron beam (not shown in FIG. 2) is injected via a first beam tunnel (23). The electron beam and electromagnetic radiation interact along the interaction section of waveguide (15)

FIG. 5A shows a cross-sectional view (not to scale) of a section of the device (10) in which the lid or roof is in communication with each of the opposing walls, while FIG. 5B shows a cross-sectional view (not to scale) of a section of the device (10) in which the lid or roof is removed or detached from the walls. The design of the present invention minimises field strength where the lid and walls meet. Consequently a preferred mode of manufacture is to make the walls and base as a single component, attach the pillars (21) to the base, and then make a joint where the walls and lid meet, because this reduces the criticality of the joint.

In the interaction section (15), an electron beam passes between rows of pillars (21). The present invention supports a cylindrical electron beam , which is straightforward to focus and to generate (for example by well-established Pierce electron guns).

Figure 3:
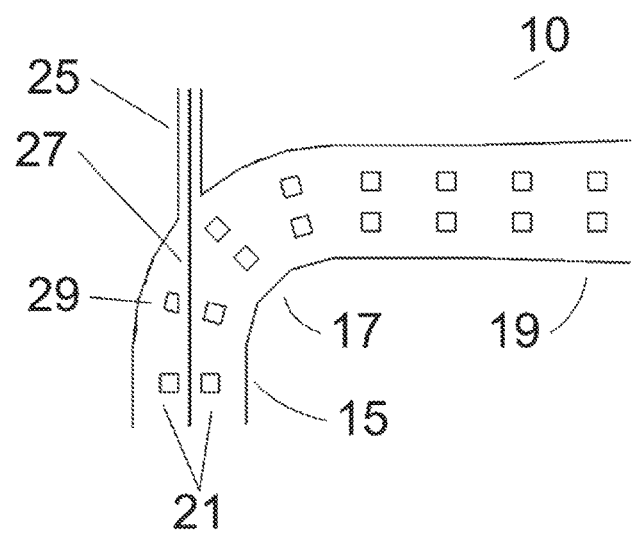
FIG. 3 shows a plan view of part of an embodiment of the present invention.

FIG. 3 shows a plan view of part of an embodiment of the present invention. This figure is not to scale.

FIG. 3 shows a plan view of a second operative section of an embodiment of the present invention (10). This comprises the interaction section of waveguide (15) with rectangular cross-section, connected to a second curved section of waveguide (17) with rectangular cross-section, connected to a third linear section of waveguide (19) with rectangular cross-section.

Electromagnetic radiation and an electron beam (27) interact in the interaction section of waveguide (15). At the second curved section (17) the electron beam (27) exits the waveguide (17) via a second beam tunnel (25), and the electromagnetic radiation passes around the curve (17) to enter the third linear section of waveguide (19).

An important feature of the present invention is that within the curved sections of waveguide (13 and 17) certain pillars (e.g., 29) may differ in shape from the remainder of the pillars (21) in order to avoid intersecting the electron beam (27). For example one or more pillars (29) may have part of their cross-section removed where the pillars (29) would otherwise obstruct the electron beam (27).

A further important feature of the present invention is that the bending geometry permits the design of custom tapered coupling sections (11 and 19) of pillars (21). FIG. 1 shows only a simple embodiment (parallel rows of pillars having reduced height toward the first microwave flange (41) and the second microwave flange (51)). Because the curves (13 and 17) separate the interaction section (15) from the coupling sections (11 and 19), the interaction section (15) and coupling sections (11 and 19) may be designed independently without any interacting constraints. Consequently further embodiments may be produced using a different geometry and/or taper. For example, in certain situations it may be envisaged that arranging the row of pillars to converge or diverge towards the walls could improve the performance.

The radii of the curved sections (13 and 17) may be varied between embodiments in order to optimise performance according to the respective requirements.

Furthermore, although FIG. 1 shows ninety degree curves, the degree of curvature of the curved sections (13 and 17) may be varied between embodiments in order to optimise performance according to the respective requirements.

At the external ends of the device (i.e., attaching to the first microwave flange 41 and the second microwave flange 51) coupling sections of waveguide (not shown) may be provided as is well known in the art, to allow entry and exit of the electromagnetic wave. Amplification is achieved by interaction of the electromagnetic wave and the electron beam (27) via the geometry of the waveguide and the pillars (21 and 29, as shown in FIG. 3). The present invention may also be used as an oscillator in the well-known manner, by providing a coupling section (wave output; not shown) at one end only and providing no input signal.

Components of the device (10) may be manufactured in any material with good electrical conductivity, or any suitable substrate coated with a material with good electrical conductivity.

Suitable materials with good electrical conductivity include many metals for example aluminium, copper or gold.

Components of the device (10) may be made in silicon coated with a conducting metal, for example gold.

Components of the device (10) may be made in double silicon-on-insulator (a silicon layer coated with gold).

Figure 7:
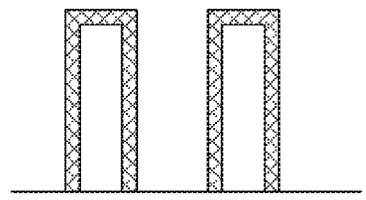
FIG. 7 shows a side view of a pair of coated pillars, in accordance with some embodiments of the present invention.

FIG. 7 shows an illustrative embodiment of a pair of pillars that have been coated. As mentioned hereinabove, the pillars can be manufactured of a first material (e.g., silicon)

and coated with a material exhibiting good electrical conductivity (e.g., a metal, copper, gold, and so forth).

Components of the device (10) may be made by additive or subtractive techniques.

In operation the device (10) is evacuated. The relative lack of internal structure in the present invention assists this function.

One specific embodiment is discussed in detail below to illustrate the design principles. It will be apparent to those skilled in the art how this embodiment can be adapted to suit other requirements. This device may be tailored for operation at a range of frequencies in the band 10 GHz to 2,000 GHz.

In this embodiment the device is designed for amplification in the 32 to 37 GHz frequency band. The dimensions of the device are as follows:

Internal width of interaction section (15)=3.45 mm
Internal height of interaction section (15)=2.5 mm
Length of interaction section (15)=115 mm
Minimum radius of curvature for curves (13 and 17)=3.2 mm
Degree of curvature at each curve (13 and 17)=90 degrees
Pillar (21 and 29) height=1.4 mm
Pillar (21 and 29) width, length=0.55 mm
Pillar (21 and 29) longitudinal stepping (periodicity)=2.3 mm
Pillar (21 and 29) transverse spacing=0.7 mm
Number of pillars of the interaction section (15)=100 (i.e., 50 pairs)
Electron beam (29) centre, below pillar top=0.15 mm
Electron beam (29) radius=0.25 mm
Electron beam (29) energy=13 keV
Input microwave power=100 milliwatts This gives an electron beam current of 200 milliamps, electron beam power of 2600 watts and electron beam current density of about 100 A cm$^{-2}$.

Figure 4:
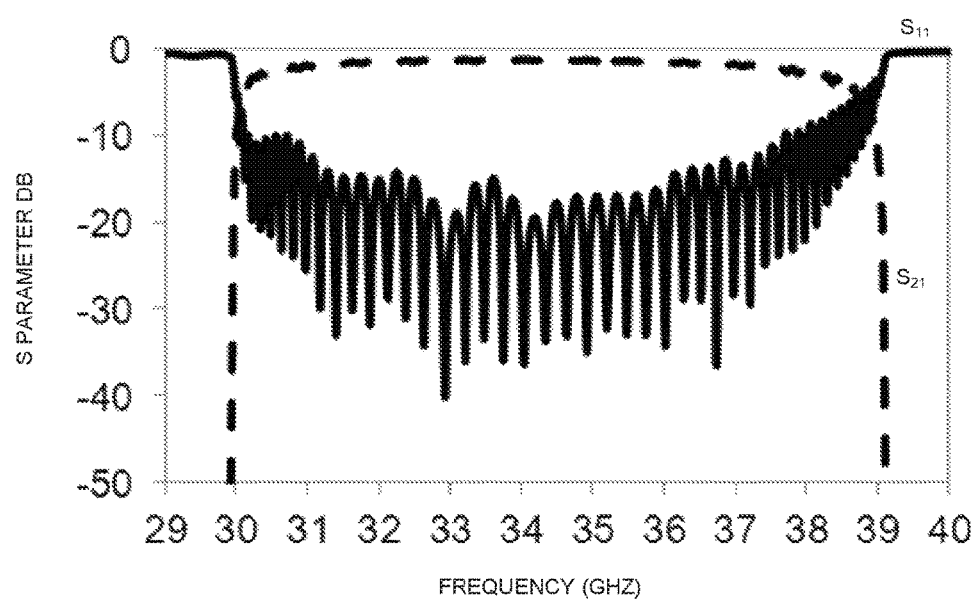
FIG. 4 shows a chart of certain S-parameters for one embodiment of the present invention.

FIG. 4 shows transmission parameters S11 and S21 as a function of the microwave frequency. The x-axis is the frequency in gigahertz from 29 GHz (left side of chart) to 40 GHz (right side of chart). The y-axis is the value of the S parameter in decibels (DB) from zero decibels (top of chart) to minus fifty decibels (bottom of chart).

The solid line is S11 representing the reflected radiation, and the dashed line is S21 representing transmitted radiation. The S-parameters refer to the well-known scattering matrix model of a multiport waveguide device.

The lower and the upper cut-off frequencies mainly depend on the internal width of the waveguide (15) and the height of the pillars (21 and 29, as shown in FIG. 3) respectively. The phase velocity is mainly determined by the longitudinal spacing of the pillars (21 and 29), the internal width of the waveguide (15) and the height of the pillars (21 and 29). It is well known to those skilled in the art how changing these physical dimensions allows the device to be tailored to give a range of electromagnetic properties, including operation at other frequencies, and operating as an amplifier or an oscillator.

While the present invention has been described in generic terms, those skilled in the art will recognise that the present invention is not limited to the cases described, but can be practised with modification and alteration within the scope of the appended claims. The description and figures are thus to be regarded as illustrative instead of limiting.

The invention claimed is:

1. A rectangular section waveguide providing amplification of an electromagnetic wave via interaction with an electron beam, the waveguide comprising:
a base;
a first wall connected to the base;
a second wall opposing the first wall and connected to the base;
a roof connectable to the first wall and the second wall;
a linear interaction channel defined by two parallel rows of pillars, each pillar attached substantially perpendicularly to the base of the waveguide; and
a first curved part and a second curved part coupled to opposing ends of the linear interaction channel, wherein the rows of pillars extend through the first and second curved parts of the waveguide, and wherein:
the electron beam enters the waveguide at the first curved part of the waveguide, traverses the linear interaction channel, and exits the waveguide at the second curved part of the waveguide.

2. The waveguide of claim 1, comprising a void between a top of each pillar and the roof of the waveguide.

3. The waveguide of claim 1, wherein the first and second curved parts of the waveguide are configured so that the base and roof of the waveguide are planar.

4. The waveguide of claim 1, wherein the roof of the waveguide may be attached to complete manufacture and subsequently detached and re-attached.

5. The waveguide of claim 1, wherein the pillars are not attached to the first wall or the second wall of the waveguide.

6. The waveguide of claim 1, wherein at least one pillar in each curved part of the waveguide is modified in shape relative to other said pillars.

7. The waveguide of claim 1, operating in the 10 GHz to 2,000 GHz band.

8. The waveguide of claim 1, operating in the 200 GHz to 1,000 GHz band.

9. The waveguide of claim 1, operating in the 25 GHz to 250 GHz band.

10. The waveguide of claim 1, operating in the 30 GHz to 40 GHz band.

11. The waveguide of claim 1, wherein the pillars are substantially square in section.

12. The waveguide of claim 1, wherein the pillars are substantially circular in section.

13. The waveguide of claim 1, wherein the pillars are substantially triangular in section.

14. The waveguide of claim 1, wherein the pillars comprise metal components.

15. The waveguide of claim 1, wherein the pillars comprise components coated in metal.

16. The waveguide of claim 1, wherein the pillars are substantially rectangular in section.

17. The waveguide of claim 1, wherein the pillars are substantially elliptical in section.

18. The waveguide of claim 1, wherein the pillars extend into a first tapered waveguide portion coupled to the first curved part.

19. The waveguide of claim 1, wherein the pillars extend into a second tapered waveguide portion coupled to the second curved part.

* * * * *